United States Patent
Kim et al.

(10) Patent No.: US 12,385,970 B2
(45) Date of Patent: Aug. 12, 2025

(54) TEST SOCKET AND APPARATUS FOR TESTING A SEMICONDUCTOR PACKAGE

(71) Applicant: STATS ChipPAC Pte. Ltd., Singapore (SG)

(72) Inventors: Wonjung Kim, Incheon (KR); Zunbae Moon, Gyeonggi-do (KR); Kyouyong Han, Incheon (KR)

(*) Notice: Subject to any disclaimer, the term of this patent is extended or adjusted under 35 U.S.C. 154(b) by 122 days.

(21) Appl. No.: 18/180,103

(22) Filed: Mar. 7, 2023

(65) Prior Publication Data

US 2023/0288474 A1    Sep. 14, 2023

(30) Foreign Application Priority Data

Mar. 11, 2022    (CN) .................... 202210238837.4

(51) Int. Cl.
  *G01R 31/28*    (2006.01)
  *G01R 1/04*    (2006.01)

(52) U.S. Cl.
  CPC ....... *G01R 31/2896* (2013.01); *G01R 1/0441* (2013.01)

(58) Field of Classification Search
  CPC .................... G01R 31/2896; G01R 1/0441
  See application file for complete search history.

(56) References Cited

U.S. PATENT DOCUMENTS

| | | | | |
|---|---|---|---|---|
| 6,060,891 A * | 5/2000 | Hembree | ............... | G01R 1/073 324/755.04 |
| 6,489,790 B1 | 12/2002 | An et al. | | |
| 8,334,595 B2 * | 12/2012 | Jung | ................... | G01R 1/06761 439/91 |
| 9,488,675 B2 * | 11/2016 | Lee | ....................... | H01R 43/002 |
| 2015/0293147 A1 | 10/2015 | Lee | | |
| 2015/0377923 A1 | 12/2015 | Lee | | |
| 2018/0348256 A1 * | 12/2018 | Hwang | .............. | G01R 1/06727 |
| 2021/0319928 A1 | 10/2021 | Kim | | |

FOREIGN PATENT DOCUMENTS

| | | |
|---|---|---|
| CN | 102346199 A | 2/2012 |
| CN | 105008940 A | 10/2015 |
| TW | 200605439 A | 2/2006 |
| TW | 201541087 A | 11/2015 |
| TW | 202012940 A | 4/2020 |

* cited by examiner

*Primary Examiner* — Reena Aurora (74) *Attorney, Agent, or Firm* — .Junhe Law Office, P.C.; Yi Zhang (57) ABSTRACT

A test socket and a test apparatus for testing a semiconductor package are provided. The test socket includes: a first connection structure including a first insulating body and a plurality of conductive plugs within the first insulating body; and a second connection structure disposed on the first connection structure and including a second insulating body and a plurality of elastic conductive pillars, the second insulating body being elastic, and the plurality of elastic conductive pillars being formed by arranging a plurality of conductive particles in the second insulating body in a vertical direction; wherein the plurality of elastic conductive pillars are in vertical alignment with the plurality of plugs of the first connection structure, respectively, and the conductive particles in each of the plurality of elastic conductive pillars can produce electrical conductivity in response to an external pressure applied onto the elastic conductive pillar.

10 Claims, 6 Drawing Sheets

TEST SOCKET AND APPARATUS FOR TESTING A SEMICONDUCTOR PACKAGE

TECHNICAL FIELD

The present application generally relates to semiconductor technology, and more particularly, to a test socket and an apparatus for testing a semiconductor package.

BACKGROUND OF THE INVENTION

The semiconductor industry is constantly faced with complex integration challenges as consumers want their electronics to be smaller, faster and higher performance with more and more functionalities packed into a single device. With such needs, Ball Grid Array (BGA) type semiconductor packages which implement a high pin count by forming a plurality of external terminals having a ball shape at a bottom surface of a body portion thereof have been favored.

Semiconductor packages that have undergone complicated processing are subjected to various types of electrical tests so as to test their characteristics and for defects thereof. To this end, a test socket is used to electrically connect metallic wires or contact pads of a socket board (for example, a printed circuit board) mounted in test equipment and external terminals of a semiconductor package to be tested. That is, when testing a semiconductor package, the test socket serves as an interface to electrically connect the socket board of the test equipment and the semiconductor package under test.

Therefore, a need exists for a high reliable test apparatus for testing a semiconductor package.

SUMMARY OF THE INVENTION

An objective of the present application is to provide a high reliable test socket or test apparatus for testing a semiconductor package.

According to an aspect of the present application, a test socket for testing a semiconductor package is provided. The test socket may include: a first connection structure including a first insulating body and a plurality of conductive plugs within the first insulating body; and a second connection structure disposed on the first connection structure and including a second insulating body and a plurality of elastic conductive pillars, the second insulating body being elastic, and the plurality of elastic conductive pillars being formed by arranging a plurality of conductive particles in the second insulating body in a vertical direction; wherein the plurality of elastic conductive pillars are in vertical alignment with the plurality of plugs of the first connection structure, respectively, and the conductive particles in each of the plurality of elastic conductive pillars can produce electrical conductivity in response to an external pressure applied onto the elastic conductive pillar.

According to another aspect of the present application, a test apparatus for testing a semiconductor package is provided. The test apparatus may include: a socket board having a plurality of contact pads; a test socket for connecting the contact pads of the socket board with external terminals of the semiconductor package, and including: a first connection structure including a first insulating body and a plurality of conductive plugs within the first insulating body; and a second connection structure disposed on the first connection structure and including a second insulating body and a plurality of elastic conductive pillars, the second insulating body being elastic, and the plurality of elastic conductive pillars being formed by arranging a plurality of conductive particles in the second insulating body in a vertical direction; wherein the plurality of elastic conductive pillars are in vertical alignment with the plurality of plugs of the first connection structure, respectively, and the conductive particles in each of the plurality of elastic conductive pillars can produce electrical conductivity in response to an external pressure applied onto the elastic conductive pillar.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
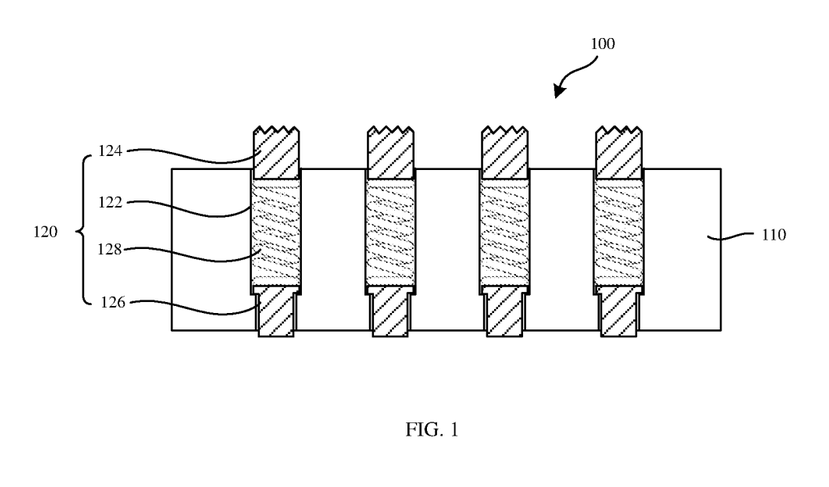
FIG. 1 is a cross-sectional view of a Pogo type test socket for testing a semiconductor package.

FIG. 1 is a cross-sectional view of a Pogo type test socket 100 for testing a semiconductor package.

Referring to FIG. 1, the test socket 100 includes an insulating body 110 and a plurality of Pogo pins 120 within the insulating body 110. The Pogo pins 120 are used for electrically connecting external terminals of a device under test (not shown) and contact pads of a test board (not shown), and the main body 110 can fix and support the Pogo pins 120 to protect them from deformation and external physical impact. As shown in FIG. 1, each Pogo pin 120 includes a pipe-shaped pin body 122, a metallic top contactor 124 coupled to a top end of the pin body 122, a metallic bottom contactor 126 coupled to a bottom end of the pin body 122, and a compressible coil spring 128 disposed inside the pin body 122. The compressible coil spring 128 can contact with the top contactor 124 at its top end, and contact with the bottom contactor 126 at its bottom end. With these configurations, when the test socket 100 is used for testing a semiconductor package, the semiconductor package under test can be loaded onto the test socket 100, with the top contactors 124 contacting with external terminals of the semiconductor package and the bottom contactors 126 contacting with contact pads of a test board. An external force can be applied onto the semiconductor package, thereby the semiconductor package pressing the top contactors 124 of the test socket 100 downward. As such, the coil spring 128 can provide an elastic connection between the external terminals of the semiconductor package and the contact pads of the test board.

However, when the test socket 100 is connected to solder balls or solder bumps of the semiconductor package under test, the top contactors 124 may scratch and damage the solder balls or the solder bumps, producing defects such as burrs. The burrs may establish undesired short circuit currents with its adjacent solder balls or solder bumps, bringing down the yield. Furthermore, due to a substantial length and the coiled shape of the springs 128, a signal integrity (SI) problem may be caused at a high-frequency signal test.

Figure 2:
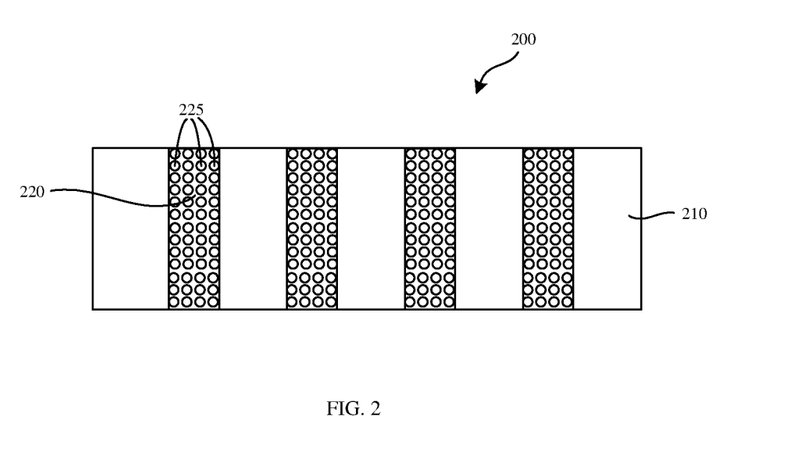
FIG. 2 is a cross-sectional view of a rubber type test socket for testing a semiconductor package.

FIG. 2 is a cross-sectional view of a rubber type test socket 200 for testing a semiconductor package.

Referring to FIG. 2, the test socket 200 includes an insulating body 210 and a plurality of pressure conductive rubber pillars 220 within the insulating body 210. The insulating body 210 may be made of solidified insulating silicone powder, for example. The pressure conductive rubber pillars 220 may be made by dispersing conductive powder 225 into predetermined sites of the insulating body 210. As shown in FIG. 2, the pressure conductive rubber pillars 220 are positioned and oriented perpendicular to the insulating body 210. A top surface of each pressure conductive rubber pillar 220 is exposed from a top surface of the insulating body 210, and a bottom surface of each pressure conductive rubber pillar 220 is exposed from a bottom surface of the insulating body 210. When the test socket 200 is used for testing a semiconductor package (not shown), the semiconductor package is loaded onto the top surface of the insulating body 210, with the top surfaces of the pressure conductive rubber pillars 220 contacting with external terminals of the semiconductor package and the bottom surfaces of the pressure conductive rubber pillars 220 contacting with contact pads of a test board (not shown). An external force can be applied onto the semiconductor package under test, thereby the semiconductor package pressing against the top surfaces of the pressure conductive rubber pillars 220. In this way, the conductive powder 225 within the pressure conductive rubber pillars 220 can come into contact with each other, so as to produce electrical conductivity between the external terminals of the semiconductor package and the contact pads of the test board.

However, the rubber type test socket 200 as shown in FIG. 2 has a higher resistance than the Pogo type test socket 100 as shown in FIG. 1, and thus cannot bear large current consumption.

To address at least one of the above problems, a test socket for testing a semiconductor package is provided. The test socket may include a first connection structure and a second connection structure disposed on the first connection structure. The first connection structure may include a first insulating body and a plurality of conductive plugs within the first insulating body. The second connection structure may be a rubber type test socket, for example, similar as the rubber type test socket 200 shown in FIG. 2, but may have a shorter length. Specifically, the second connection structure may include a second insulating body and a plurality of elastic conductive pillars. The plurality of elastic conductive pillars may be formed by dispersing a plurality of conductive particles into an elastic material, and the pillars may extend in a thickness direction of the second insulating body and passes through the second insulating body. The plurality of elastic conductive pillars may be in vertical alignment with the plurality of plugs of the first connection structure, respectively. In response to an external pressure applied onto each elastic conductive pillar, the conductive particles in the elastic conductive pillar can produce electrical conductivity. Compared with a conventional Pogo type test socket, the test socket according to embodiments of the present application can provide a wider contact area and better high-frequency performance, and would not damage external terminals of the semiconductor package under test. Compared with a conventional rubber type test socket, the test socket according to the embodiments of the present application can bear more current consumption because a large portion of the test socket contains conductive plugs having high electrical conductivities.

Figure 3:
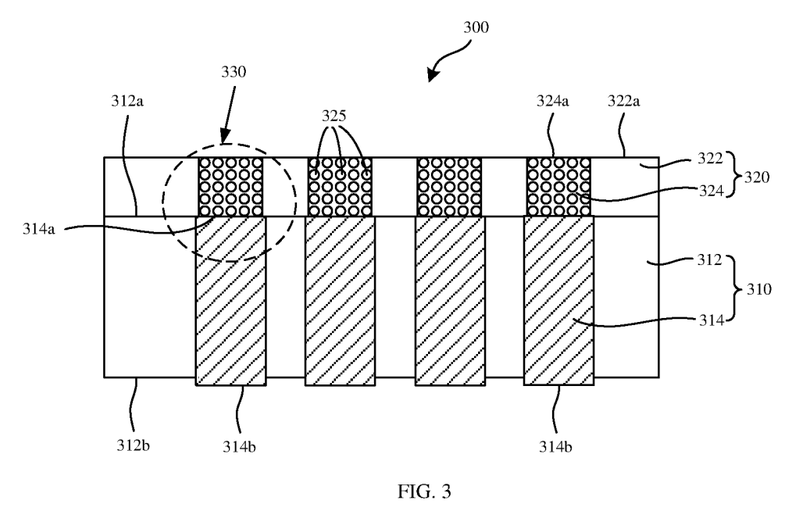
FIG. 3 is a cross-sectional view of a test socket for testing a semiconductor package according to an embodiment of the present application.

Referring to FIG. 3, a cross-sectional view of a test socket 300 is illustrated according to an embodiment of the present application. As shown in FIG. 3, the test socket 300 may include a first connection structure 310 and a second connection structure 320.

The first connection structure 310 may include a first insulating body 312 and a plurality of conductive plugs 314 within the first insulating body 312. The first insulating body 312 can fix and support the conductive plugs 314 to protect them from deformation and external physical impact. In some embodiments, the first insulating body 312 may be made of a plastic material or a resin material, for example, a thermoset resin. In some embodiments, the conductive plugs 314 may be made of a metallic material having excellent electrical conductivity, such as Al, Cu, Ag, Pt, Au, and the like. The present application does not limit the material of the first insulating body 312 and the conductive plugs 314 to that disclosed herein.

In some embodiments, the conductive plug 314 may be a Pogo pin without spring. That is, the plug 314 may include a pipe-shaped pin body, a metallic top contactor coupled to a top end of the pin body, and a metallic bottom contactor coupled to a bottom end of the pin body. The top contactor may contact with the bottom contactor. Thus, the plug 314 can be manufactured using a process for manufacturing a Pogo pin without forming the spring between the top contactor and the bottom contactor.

In some embodiments, the plug 314 is formed as a single piece, and can be formed in a single step. For example, a plurality of through-holes can be formed through the first insulating body 312, and then a metallic material can be deposited or plated into the through-holes to form the plugs 314.

As shown in FIG. 3, a bottom surface 314b of the conductive plug 314 may protrude from a bottom surface 312b of the first insulating body 312, so as to facilitate the contact with an external contact pad or a metallic wire of a test board (not shown). In some other embodiments, the bottom surface 314b of the conductive plug 314 may be coplanar with the bottom surface of the first insulating body 312.

Figure 4A:
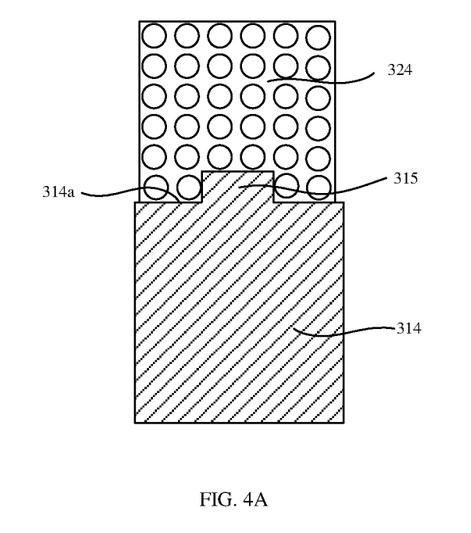
FIG. 4A is an enlarged view of a portion of the test socket of FIG. 3 according to an embodiment of the present application.

FIG. 4A is an enlarged view of a portion 330 of the test socket 300 of FIG. 3 according to an embodiment of the present application. As shown in FIG. 4A, a protruding portion 315 is formed on the top surface 314a of the conductive plug 314 and embedded into an elastic conductive pillar 324 of the second connection structure. The protruding portion 315 can provide a larger interface between the elastic conductive pillar 324 and the conductive plug 314, and thus the adhesion and conductivity between the conductive plug 314 and the elastic conductive pillar 324 can be improved significantly. In the example shown in FIG. 4A, the protruding portion 315 has a rectangular cross section. In other examples, the protruding portion 315 may also have a trapezoidal, triangular, or semicircular cross section.

Figure 4B:
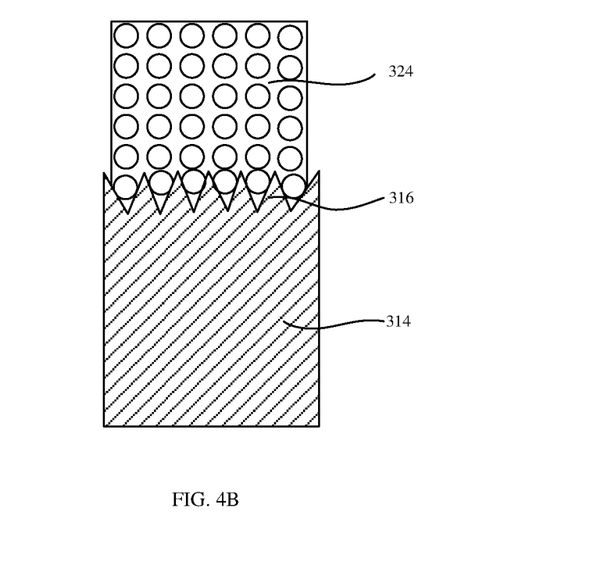
FIG. 4B is an enlarged view of a portion of the test socket of FIG. 3 according to an embodiment of the present application.

FIG. 4B is an enlarged view of a portion 330 of the test socket 300 of FIG. 3 according to another embodiment of the present application. As shown in FIG. 4B, more than one protruding portions 316 are formed on the top surface of the conductive plug 314, which can further increase the contact area at the interface between the elastic conductive pillar 324 and the conductive plug 314.

However, the present application does not limit the specific number or shape of the protruding portion(s) formed on the top surface of the conductive plug to those disclosed in FIG. 4A and FIG. 4B, and even in some other embodiments, there may be no protruding portion formed on the top surface of the conductive plug, that is, the top surface of the conductive plug is flat.

Still referring to FIG. 3, the second connection structure 320 is disposed on and connected to the first connection structure 310. The second connection structure 320 includes a second insulating body 322 and a plurality of elastic conductive pillars 324 inside the second insulating body 322.

The plurality of elastic conductive pillars 324 may be formed by dispersing a plurality of conductive particles 325 into an elastic material, and the pillars 324 may extend in a thickness direction of the second insulating body 322. In an example, insulating powder and conductive powder may be mixed at a predefined ratio and melted in a mold frame. The insulating powder may be made of non-conductive silicone such as silicon rubber, and the conductive powder may be metallic powder such as gold (Au) or nickel (Ni). Then, the conductive powder can be brought to a site where the elastic conductive pillars 324 will be formed. Specifically, a positive voltage and the ground or a negative voltage may be applied to the two opposite surfaces of the second insulating body 322, respectively. The voltage difference may then cause the conductive particles 325 contained in the melted mixture to migrate into a columnar region so as to form the elastic conductive pillars 324. Afterwards, the second connection structure 320 is completed by solidifying the melted mixture.

As shown in FIG. 3, the plurality of elastic conductive pillars 324 are in vertical alignment with the plurality of plugs 314 of the first connection structure 310, respectively, and the conductive particles 325 in each of the plurality of elastic conductive pillars 324 can produce electrical conductivity in response to an external pressure applied onto the elastic conductive pillar 324.

In some embodiments, a top surface 324a of the elastic conductive pillar 324 may protrude from a top surface 322a of the second insulating body 322, so as to facilitate the pillar 324 contacting with an external terminal of a semiconductor package under test.

In some embodiments, a thickness of the first insulating body is 0.5 to 5 times (for example, 1, 2, 3 or 4 times) a thickness of the second insulating body. That is, a large portion of the test socket is composed of the first connection structure with the conductive plugs having high electrical conductivity. Thus, the test socket of the embodiments of the present application can bear more current consumption than a conventional rubber type test socket such as the rubber type test socket 200 shown in FIG. 2.

Figure 5:
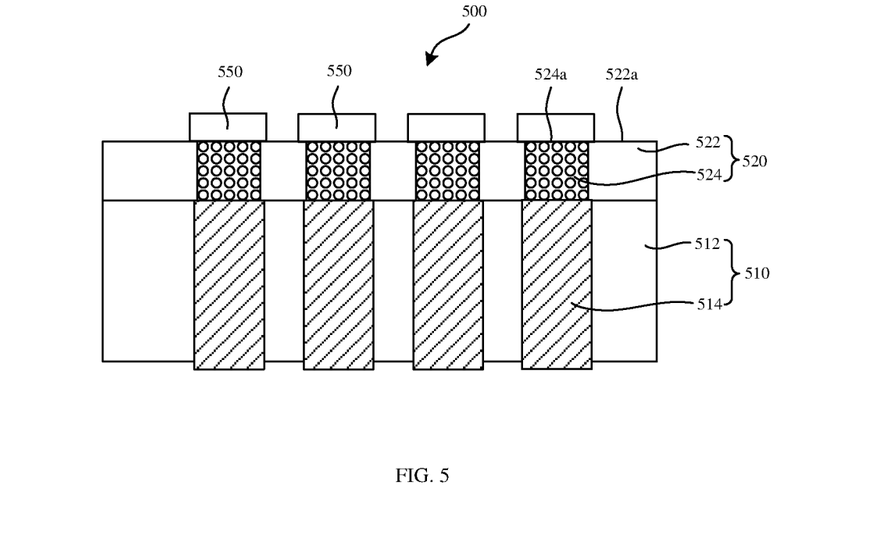
FIG. 5 is a cross-sectional view of a test socket for testing a semiconductor package according to an embodiment of the present application.

Referring to FIG. 5, a cross-sectional view of a test socket 500 is illustrated according to another embodiment of the present application. As shown in FIG. 5, the test socket 500 may include a first connection structure 510 and a second connection structure 520, which are similar as the first connection structure 310 and the second connection structure 320 of the test socket 300 shown in FIG. 3, and will not be elaborated herein. Different from the test socket 300 shown in FIG. 3, the test socket 500 shown in FIG. 5 further includes a plurality of contact pads 550 which are disposed on respective top surfaces 524a of a plurality of elastic conductive pillars 524.

In particular, the elastic conductive pillars 524 are relatively soft and thus are susceptible to wear or damage caused by repeated contact with the external terminals (for example, solder balls) of a semiconductor package under test. Defects may develop from hollows or voids or pits at the top surfaces of the elastic conductive pillars caused by the repeated pressure from the solder balls of the semiconductor package under test. In order to solve the problem, the contact pads 550 are formed on the top surfaces 524a of the elastic conductive pillars 524.

In some embodiments, the contact pad 550 may be a metal plate. The metal plate may have a higher stiffness, such that the metal plate can withstand higher contact pressure. The metal plate may also have a better conductivity than the elastic conductive pillar 524, such that the metal plate can form a robust electric connection with the solder ball of the semiconductor package under test, even without excessive contact pressure by the semiconductor package. Thus, the contact pads 550 can protect the elastic conductive pillars 524, and thereby helping lengthen the life span of the test socket 500.

In some embodiments, the contact pad 550 may be a metal ring. For example, a top end of the elastic conductive pillar 524 may protrude from a top surface 522a of the second insulating body 522, and the metal ring may be disposed at a periphery of the top end of the elastic conductive pillar 524. The metal ring can similarly protect the elastic conductive pillar 524 and help lengthen the life span of the test socket 500.

Figure 6A:
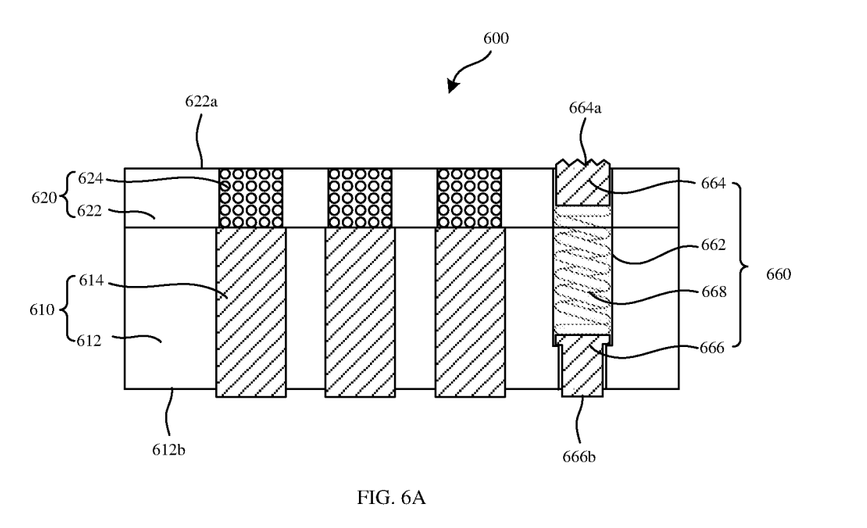
FIG. 6A is a cross-sectional view of a test socket for testing a semiconductor package according to an embodiment of the present application.
Figure 6B:
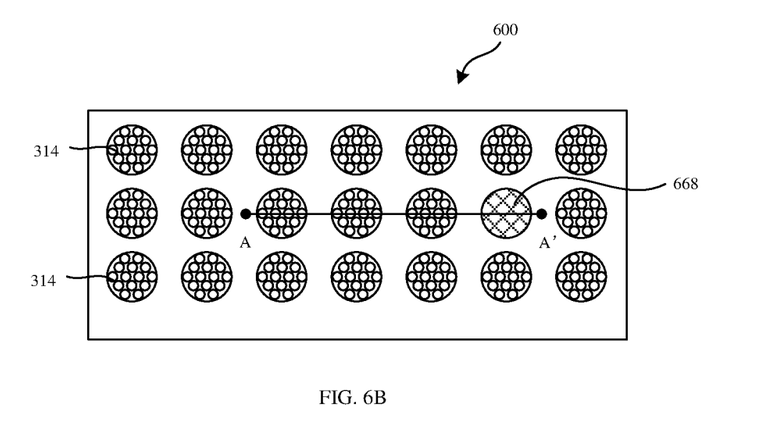
FIG. 6B is a top view of the test socket of FIG. 6A according to an embodiment of the present application.

According to an embodiment of the present application, a cross-sectional view and a top view of a test socket 600 are respectively illustrated in FIGS. 6A and 6B. FIG. 6A is a cross-sectional view of the test socket 600 along a section line A-A' shown in FIG. 6B.

As shown in FIG. 6A, the test socket 600 may include a first connection structure 610 and a second connection structure 620, which are similar as the first connection structure 310 and a second connection structure 320 of the test socket 300 shown in FIG. 3, and will not be elaborated herein. Different from the test socket 300 shown in FIG. 3, the test socket 600 shown in FIGS. 6A and 6B further includes one or more Pogo pins 660. In particular, the Pogo pin 660 may extend through a first insulating body 612 of a first connection structure 610 and the second insulating body 622 of the second connection structure 620.

Referring to FIG. 6, the Pogo pin 660 includes a pipe-shaped pin body 662, a metallic top contactor 664 coupled to a top end of the pin body 662, a metallic bottom contactor 666 coupled to a bottom end of the pin body 662, and a compressible coil spring 668 disposed inside the pin body 662. The compressible coil spring 668 contacts with the top contactor 664 at its top end, and contacts with the bottom contactor 666 at its bottom end. In an example, the pipe-shaped pin body 662, the top contactor 664 and the bottom contactor 666 are made of brass or copper, and the coil spring 668 is made of copper alloys or spring steel. However, the present application does not limit the material of the Pogo pin 660 to that disclosed herein. With these configurations, when the test socket 600 is used for testing a semiconductor package, the semiconductor package can be loaded onto the test socket 600, with the top contactors 664 contacting with external terminals of the semiconductor package and the bottom contactors 666 contacting with contact pads of a test board. Furthermore, an external force can be applied onto the semiconductor package under test, such that the external terminals of the semiconductor package can press against the top contactors 664, and the coil spring 668 can provide an elastic contact between the external terminals of the semiconductor package and the contact pads of the test board.

In the example shown in FIG. 6, the bottom surfaces 666b of the bottom contactors 666 may protrude from the bottom surface 612b of the first insulating body 612 so as to facilitate a contact with the contact pads of the test board. The top surfaces 664a of the top contactors 664 may protrude from a top surface 622a of a second insulating layer 622. The top surfaces 664a may have peaks and valleys so as to facilitate contacting with external terminals of a semiconductor package under test.

The Pogo pin 660 of the test socket 600 may have a lower resistance and higher current capacity than the pins composed of the plug 614 and the elastic conductive pillar 624. Therefore, the Pogo pin 660 can be used to connect a high current consumption terminal of the semiconductor package under test with the test board. It could be understood that, the number or location of the Pogo pin 660 shown in FIGS. 6A and 6B is exemplary only, and may vary according to actual needs.

According to another aspect of the present application, a test apparatus including any of the test sockets described above is also provided.

Figure 7:
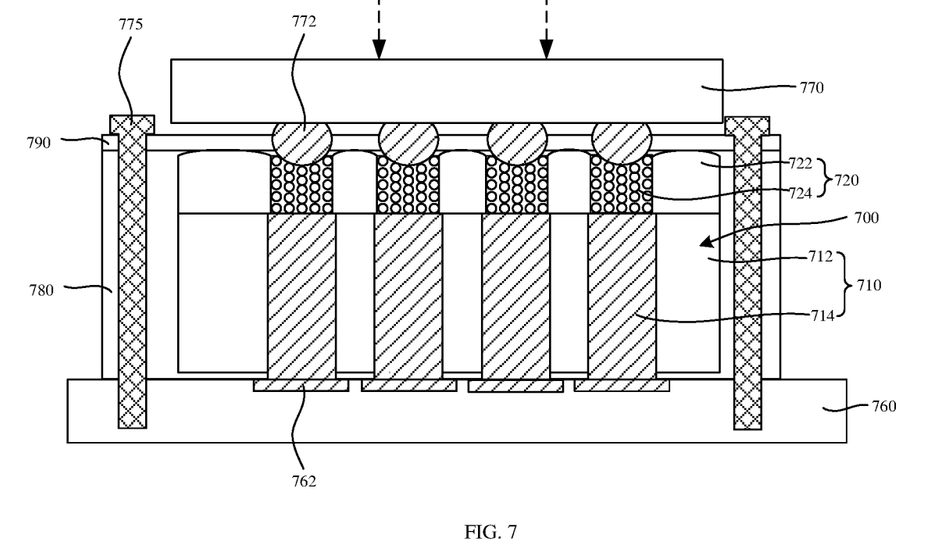
FIG. 7 is a cross-sectional view of a test apparatus for testing a semiconductor package according to an embodiment of the present application.

Referring to FIG. 7, a cross-sectional view of a test apparatus is illustrated according to an embodiment of the present application. As shown in FIG. 7, the test apparatus may include a test socket 700 and a socket board 760.

The test socket 700 shown in FIG. 7 is similar to the test socket 300 shown in FIG. 3. Specifically, the test socket 700 includes a first connection structure 710 and a second connection structure 720 disposed on the first connection structure 710. The first connection structure 710 includes a first insulating body 712 and a plurality of conductive plugs 714 within the first insulating body 712. The second connection structure 720 includes a second insulating body 722 and a plurality of elastic conductive pillars 724 within the second insulating body 722. The plurality of elastic conductive pillars 724 may be formed by dispersing a plurality of conductive particles into an elastic material in a thickness direction of the second insulating body 722. The plurality of elastic conductive pillars 724 are in vertical alignment with the plurality of plugs 714 of the first connection structure 710, respectively, and the conductive particles in each of the plurality of elastic conductive pillars 724 can produce electrical conductivity in response to an external pressure applied onto the elastic conductive pillar 724. More detail about the test socket 700 may refer to the test sockets described with reference to FIGS. 3-6, and will not be elaborated herein.

The socket board 760 may include a plurality of contact pads 762. The contact pads 762 may be coupled with a signal generator via various connection means, for example, traces, plugs or redistribution structures (RDSs) within the socket board. The signal generator can generate different signals for testing the semiconductor package. The test socket 700 can be mounted onto the socket board 760 to connect the contact pads 762 of the socket board 760 with external terminals 772 of the semiconductor package 770 under test. More details about the mounting will be described below with reference to FIG. 8 and FIG. 9.

Figure 8:
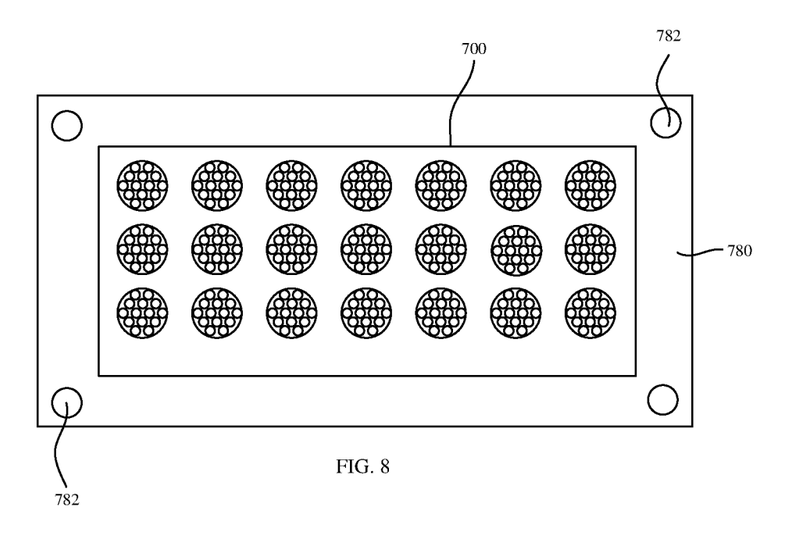
FIG. 8 is a top view of a support frame according to an embodiment of the present application.

In some embodiments, referring to FIG. 7 and FIG. 8, the test apparatus may further include a support frame 780. The support frame 780 may have a plane shape and be made of metal or plastics. The support frame 780 may have an opening in the center, and the test socket 700 may be fixed within the opening of the support frame 780. The support frame 780 may have alignment holes 782 for alignment means at its four corners. The support frame 780 can be assembled with the socket board 760 via the alignment means, and thus the test socket 700 can be mounted onto the socket board 760. For example, the assembling can be implemented by inserting a screw 775 as an alignment means into each of the alignment holes 782 of the support frame 780 and fixing the screw 775 therein. Accordingly, the screws 775 can removably fix the support frame 780 with the socket board 760.

Figure 9:
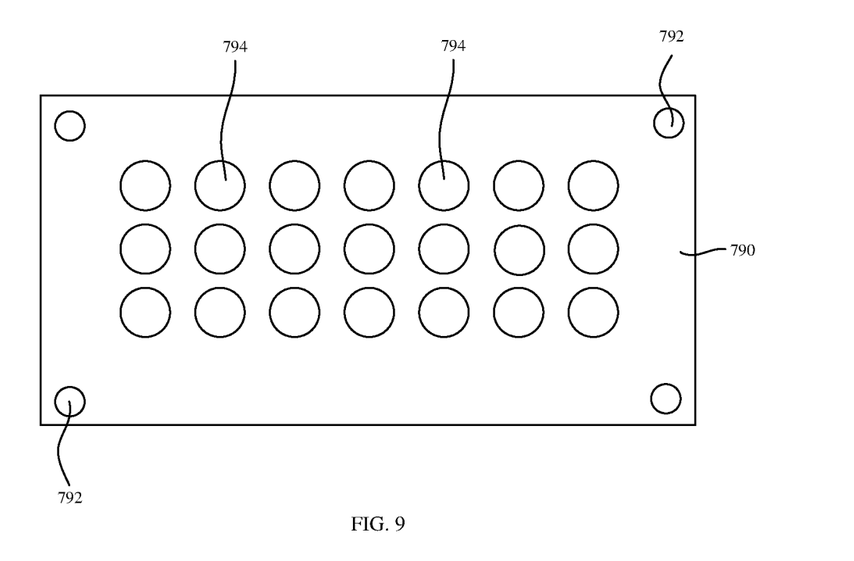
FIG. 9 is a top view of a mesh according to an embodiment of the present application.

In some embodiments, as shown in FIG. 7 and FIG. 9, the test apparatus may further include a mesh 790. The mesh 790 may be attached to the support frame 780 as shown in FIG. 7. The mesh 790 has a plurality of holes 794 in which external terminals (for example, solder balls) of the semiconductor package may sit. For example, the holes 794 may be constructed at the same interval as that of the elastic conductive pillars 724 of the test socket shown in FIG. 7. Accordingly, the mesh 790 can determine the sitting location of solder balls of the semiconductor package under test and prevent variation of the solder balls in position when the semiconductor package is being tested. The mesh 790 has four alignment holes 792, in which screws are inserted for aligning the mesh 790 with the support frame 780 and the socket board 760.

Still referring to FIG. 7, a process for testing a semiconductor package 770 using the test apparatus of the present application will be described below.

First, the socket board 760 having the test socket 700 installed thereon is prepared. The bottom surfaces of the elastic conductive pillars 724, exposed from the bottom surface of the second insulating body 722, contact with respective contact pads of the socket board 760 through the plurality of conductive plugs 714 within the first insulating body 712 to form electrical connection therebetween.

Second, the semiconductor package 770 is aligned on the test socket 700 so that solder balls 772 of the semiconductor package 770 face top parts of the elastic conductive pillars 724. Then, the semiconductor package is pressed downwards (as indicated by a dashed arrow in FIG. 7) to closely contact with the test socket 700. As such, the solder balls 772 of the semiconductor package 770 can elastically contact with the elastic conductive pillars 724. Specifically, the downward force applied on the semiconductor package 770 (or, alternatively but still within the spirit and scope of the invention, upward on the test socket 700) causes the hemispheric solder balls 772 to slightly depress the top surfaces of the elastic conductive pillars 724 and to be compressively cradled. The depressed elastic conductive pillars 724 recess downwardly and inwardly to cradle bottom peripheries of the solder balls 772, thereby forming smooth but forceful and slightly expanded contact regions (which may be semicircular rather than linear). The force applied by the semiconductor package 770 can be absorbed by the elastic conductive pillars 724 and the second insulating body 722, so that the solder balls 772 of the semiconductor package 770 elastically contact with the elastic conductive pillars 724, forming a robust and reliable electrical connection. After establishing an electrical connection between the socket board 760 and the semiconductor package 770 via the test socket 700, one or more test processes may be performed by supplying test signals from the contact pad 762 of the socket board 760 through the plugs 714 and the elastic conductive pillars 724 to the solder balls 772 of the semiconductor package 770. In this way, signal paths within the semiconductor package 770 can be tested.

The discussion herein included numerous illustrative figures that showed various portions of a test socket and a test apparatus. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A test socket for testing a semiconductor package, comprising:
   a first connection structure comprising a first insulating body and a plurality of conductive plugs within the first insulating body, wherein the conductive plugs are made of a metallic material;
   a second connection structure disposed on the first connection structure and comprising a second insulating body and a plurality of elastic conductive pillars, the second insulating body being elastic, and the plurality of elastic conductive pillars being formed by arranging a plurality of conductive particles in the second insulating body in a vertical direction;
   wherein the plurality of elastic conductive pillars are in vertical alignment with the plurality of conductive plugs of the first connection structure, respectively, and the conductive particles in each of the plurality of elastic conductive pillars can produce electrical conductivity in response to an external pressure applied onto the elastic conductive pillar; and
   one or more Pogo pins extending through the first insulating body and the second insulating body, wherein the one or more Pogo pins have a lower resistance than pins composed of the conductive plugs and the elastic conductive pillars, and are configured to connect with a high current consumption terminal of the semiconductor package under test.

2. The test socket of claim 1, wherein a bottom surface of the conductive plug protrudes from a bottom surface of the first insulating body.

3. The test socket of claim 1, wherein one or more protruding portions are formed on a top surface of the conductive plug.

4. The test socket of claim 1, wherein a top surface of the elastic conductive pillar protrudes from a top surface of the second insulating body.

5. The test socket of claim 1, wherein a contact pad is formed on a top surface of the elastic conductive pillar.

6. The test socket of claim 1, wherein a thickness of the first insulating body is 0.5 to 5 times a thickness of the second insulating body.

7. The test socket of claim 1, wherein the conductive particles comprise gold or nickel.

8. A test apparatus for testing a semiconductor package, comprising:
   a socket board having a plurality of contact pads; and a test socket for connecting the contact pads of the socket board with external terminals of the semiconductor package, and comprising:
- a first connection structure comprising a first insulating body and a plurality of conductive plugs within the first insulating body, wherein the conductive plugs are made of a metallic material;
- a second connection structure disposed on the first connection structure and comprising a second insulating body and a plurality of elastic conductive pillars, the second insulating body being elastic, and the plurality of elastic conductive pillars being formed by arranging a plurality of conductive particles in the second insulating body in a vertical direction;
- wherein the plurality of elastic conductive pillars are in vertical alignment with the plurality of plugs of the first connection structure, respectively, and the conductive particles in each of the plurality of elastic conductive pillars can produce electrical conductivity in response to an external pressure applied onto the elastic conductive pillar; and
- one or more Pogo pins extending through the first insulating body and the second insulating body, wherein the one or more Pogo pins have a lower resistance than pins composed of the conductive plugs and the elastic conductive pillars, and are configured to connect with a high current consumption terminal of the semiconductor package under test.

9. The test apparatus of claim 8, further comprising:
a support frame for mounting the test socket onto the socket board.

10. The test apparatus of claim 8, further comprising:
a mesh positioned between the semiconductor package and the test socket and including a plurality holes, which are configured to receive the external terminals of the semiconductor package such that the external terminals are able to contact the elastic conductive pillars through the holes.

* * * * *